US011064587B2

(12) United States Patent
Jung et al.

(10) Patent No.: US 11,064,587 B2
(45) Date of Patent: Jul. 13, 2021

(54) LED LIGHTING APPARATUS AND LED DRIVING CIRCUIT THEREOF

(71) Applicant: Seoul Semiconductor Co., Ltd., Ansan-si (KR)

(72) Inventors: Hye Man Jung, Ansan-si (KR); Keith Hopwood, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 0 days.

(21) Appl. No.: 16/879,721

(22) Filed: May 20, 2020

(65) Prior Publication Data

US 2020/0375001 A1 Nov. 26, 2020

(30) Foreign Application Priority Data

May 21, 2019 (KR) ........................ 10-2019-0059525
Sep. 3, 2019 (KR) ........................ 10-2019-0109017

(51) Int. Cl.

*H05B 45/375* (2020.01)
*H05B 45/20* (2020.01)
*H05B 45/44* (2020.01)
*H03K 5/24* (2006.01)

(52) U.S. Cl.

CPC ............. *H05B 45/375* (2020.01); *H03K 5/24* (2013.01); *H05B 45/20* (2020.01); *H05B 45/44* (2020.01)

(58) Field of Classification Search

CPC ...... H05B 45/375; H05B 45/20; H05B 45/44; H03K 5/24

See application file for complete search history.

(56) References Cited

U.S. PATENT DOCUMENTS

2011/0285301 A1* 11/2011 Kuang ................. H05B 45/385 315/200 R
2012/0139438 A1* 6/2012 Soleno ................... H05B 45/37 315/291
2013/0044521 A1* 2/2013 Zhao .................... H05B 45/382 363/21.17
2013/0134893 A1* 5/2013 Zimmermann ........ H05B 47/10 315/224
2015/0102742 A1* 4/2015 Deng ..................... H05B 45/37 315/205

* cited by examiner

*Primary Examiner* — Daniel D Chang

(74) *Attorney, Agent, or Firm* — H.C. Park & Associates, PLC

(57) ABSTRACT

An LED lighting apparatus including a rectifier to rectify AC voltages having different magnitudes and generate driving voltages corresponding to rectified voltages, a buck converter connected to an output terminal of the rectifier and generate an LED driving current corresponding to the driving voltages, a variable reference voltage comparator to receive the driving voltages, and generate variable reference voltages that fluctuate in correspondence to magnitudes of the output driving voltages, compare the driving voltages and the variable reference voltages, and output signals for controlling an operation of the buck converter, an LED including at least one LED group and driven by the LED driving current generated by the buck converter, and a controller including a converter controller to control the operation of the buck converter and a constant current controller to constant current-control the LED driving current applied to the at least one LED group.

18 Claims, 8 Drawing Sheets

LED LIGHTING APPARATUS AND LED DRIVING CIRCUIT THEREOF

CROSS-REFERENCE TO RELATED APPLICATIONS

This application claims priority from and the benefit of Korean Patent Application No. 10-2019-0059525, filed on May 21, 2019, and Korean Patent Application No. 10-2019-0109018, filed on Sep. 3, 2019, which are hereby incorporated by reference for all purposes as if fully set forth herein.

BACKGROUND

Field

Exemplary embodiments of the invention relate generally to an LED lighting apparatus, and, more specifically, to an AC driving type LED lighting apparatus and an LED driving circuit included in the same.

Discussion of the Background

An LED lighting apparatus has various advantages, such as low power consumption, high luminance, and long lifespan, and is gradually expanding its range of usage as a light source. For example, a light source device for landscape lighting implemented with an existing light bulb or a fluorescent light is being replaced with the LED lighting apparatus.

A landscape lighting system including the LED lighting apparatus may further include a low voltage transformer in order to receive a commercial AC voltage and supply power suitable for respective LEDs installed in various places. In general, in order to drive the LED lighting apparatus by using an AC voltage, a circuit may convert the AC voltage into a rectified voltage and adjust the number of LED light emitting elements according to the level of the input rectified voltage.

However, in a conventional landscape lighting system including the LED lighting apparatus, an input voltage input to the LED lighting apparatus generally has a large fluctuation range due to the fluctuation rate of the input commercial AC voltage and a voltage drop occurring in an electric wire for connecting the low voltage transformer and multiple LEDs.

As a large input voltage fluctuation has an adverse effect on the control characteristics of a converter in the LED lighting apparatus, as well as causing a sudden change in charge and discharge currents of a rectifier and a voltage smoothing capacitor of the converter, the lifespan of the smoothing capacitor may be shortened. In this case, a power supply in the LED lighting apparatus may be damaged before an LED light source, which may shorten the lifespan of the entire landscape lighting system.

The above information disclosed in this Background section is only for understanding of the background of the inventive concepts, and, therefore, it may contain information that does not constitute prior art.

SUMMARY

LED lighting apparatuses constructed according to exemplary embodiments of the invention include a buck converter, which receives a rectified voltage as is and generates an LED driving current corresponding to the rectified voltage, and implements a pulse current driving scheme of driving the LED by using the generated LED driving current, thereby removing an electrolytic capacitor for voltage smoothing included in an existing rectifier, and an LED driving circuit thereof.

Exemplary embodiments also provide an LED lighting apparatus that includes a variable reference voltage comparator, which uses a variable reference voltage that fluctuates according to a fluctuation range of an input AC power supply voltage, and controls the buck converter through an output signal of the comparator, thereby minimizing a change in an average current value of an LED occurring due to a fluctuation in an AC power supply voltage, which is a disadvantage of the pulse current driving characteristics, and an LED driving circuit thereof.

Additional features of the inventive concepts will be set forth in the description which follows, and in part will be apparent from the description, or may be learned by practice of the inventive concepts.

An LED lighting apparatus according to an exemplary embodiment includes a rectifier configured to rectify AC voltages having different magnitudes and generate driving voltages corresponding to rectified voltages, a buck converter connected to an output terminal of the rectifier, and configured to receive the driving voltages and generate an LED driving current corresponding to the driving voltages, a variable reference voltage comparator configured to receive the driving voltages output from the rectifier, and generate variable reference voltages that fluctuate in correspondence to magnitudes of the output driving voltages, compare the driving voltages and the variable reference voltages, and output signals for controlling an operation of the buck converter, an LED including at least one LED group and configured to be driven by the LED driving current generated by the buck converter, and a controller including a converter controller configured to control the operation of the buck converter and a constant current controller configured to constant current-control the LED driving current applied to the at least one LED group.

The buck converter may include a control switch connected to an output terminal of the rectifier, and configured to be controlled by a control signal of the converter controller, and a first inductor connected between the control switch and the LED, and configured to generate the LED driving current.

The variable reference voltage comparator may include a driving voltage detection circuit including a plurality of first voltage dividing resistors connected in series between a first node connected to the output terminal of the rectifier and a ground, a variable reference voltage generation circuit including a plurality of second voltage dividing resistors connected in series between the first node connected to the output terminal of the rectifier and the ground, and a holding capacitor connected in parallel to one of the second voltage dividing resistors, and a comparator configured to compare an instantaneous value of the driving voltage detected by the driving voltage detection circuit with a variable reference voltage output from the variable reference voltage generation circuit, and to output an output signal to the converter controller.

A second node between the first voltage dividing resistors may be connected to a first input terminal of the comparator, and a third node between the second voltage dividing resistors may be connected to a second input terminal of the comparator.

The first input terminal of the comparator may be a positive input terminal of the comparator and the second input terminal of the comparator may be a negative input terminal of the comparator.

The output signal from the comparator may have the same magnitude and width regardless of a magnitude of the driving voltage output from the rectifier.

The AC voltages having different magnitudes may include a first input voltage having a first magnitude and a second input voltage having a second magnitude, and the rectifier may be configured to generate a first driving voltage in correspondence to the first input voltage a second driving voltage in correspondence to the second input voltage.

The variable reference voltage comparator may be configured to generate a first variable reference voltage corresponding to a magnitude of the first driving voltage and a second variable reference voltage corresponding to a magnitude of the second driving voltage, and a difference between the magnitudes of the first and second driving voltages may be substantially equal to a difference between the magnitudes of the first and second variable reference voltages.

The LED may include a first switch connected to a first node connected to the output terminal of the rectifier and configured to receive a first control signal, a first LED group configured to be selectively connected to the first node by the first switch, a second LED group connected in series with the first LED group, a third LED group configured to be selectively connected to the first node by the first switch, a fourth LED group connected in series with the third LED group, and a second switch configured to receive a second control signal and selectively connect an output terminal of the second LED group or the fourth LED group and the constant current controller.

The controller may further include a color temperature controller configured to receive a color temperature selection signal and output the first and second control signals.

An LED driving circuit according to another exemplary embodiment includes a buck converter configured to receive rectified voltages having different magnitudes as driving voltages and generate an LED driving current corresponding to the driving voltages, a variable reference voltage comparator configured to receive the driving voltages having different magnitudes, generate variable reference voltages that fluctuate in correspondence to magnitudes of the input driving voltages, compare the driving voltages and the variable reference voltages, and output signals to control an operation of the buck converter, and a converter controller configured to control the operation of the buck converter.

The buck converter may include a control switch controlled by a control signal of the converter controller, and a first inductor connected between the control switch and at least one LED group, and configured to generate the LED driving current.

The variable reference voltage comparator may include a driving voltage detection circuit including a first resistor and a second resistor connected in series to divide the input driving voltage, a variable reference voltage generation circuit including a third resistor and a fourth resistor connected in series to divide the input driving voltage, and a holding capacitor connected in parallel to the fourth resistor, and a comparator configured to compare an instantaneous value of the driving voltage detected by the driving voltage detection circuit with a variable reference voltage output from the variable reference voltage generation circuit, and output an output signal to the converter controller.

A second node between the first resistor and the second resistor may be connected to a first input terminal of the comparator, and a third node between the third resistor and the fourth resistor may be connected to a second input terminal of the comparator.

The first input terminal of the comparator may be a positive input terminal of the comparator and the second input terminal of the comparator may be a negative input terminal of the comparator.

The output signal from the comparator may have the same magnitude and width regardless of a magnitude of the driving voltage output from the rectifier.

The driving voltages having different magnitudes may include a first driving voltage having a first magnitude and a second driving voltage having a second magnitude.

The variable reference voltage comparator may be configured to generate a first variable reference voltage corresponding to a magnitude of the first driving voltage and generate a second variable reference voltage corresponding to a magnitude of the second driving voltage, and a difference between the magnitudes of the first and second driving voltages may be substantially equal to a difference between the magnitudes of the first and second variable reference voltages.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
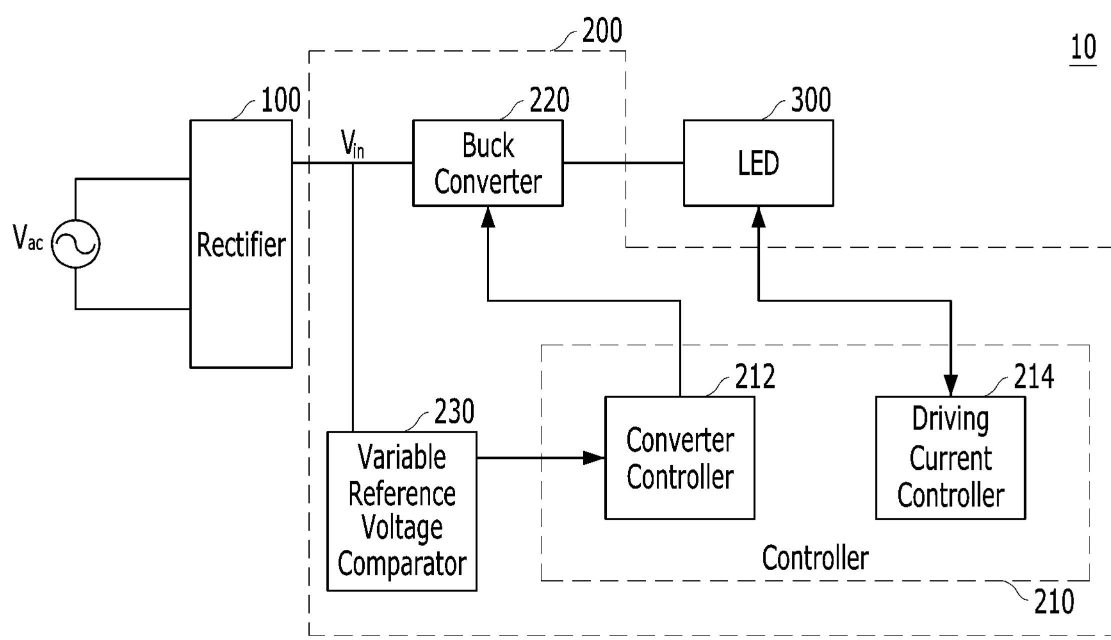
FIG. 1 is a block diagram of an LED lighting apparatus according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure. Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

As is customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
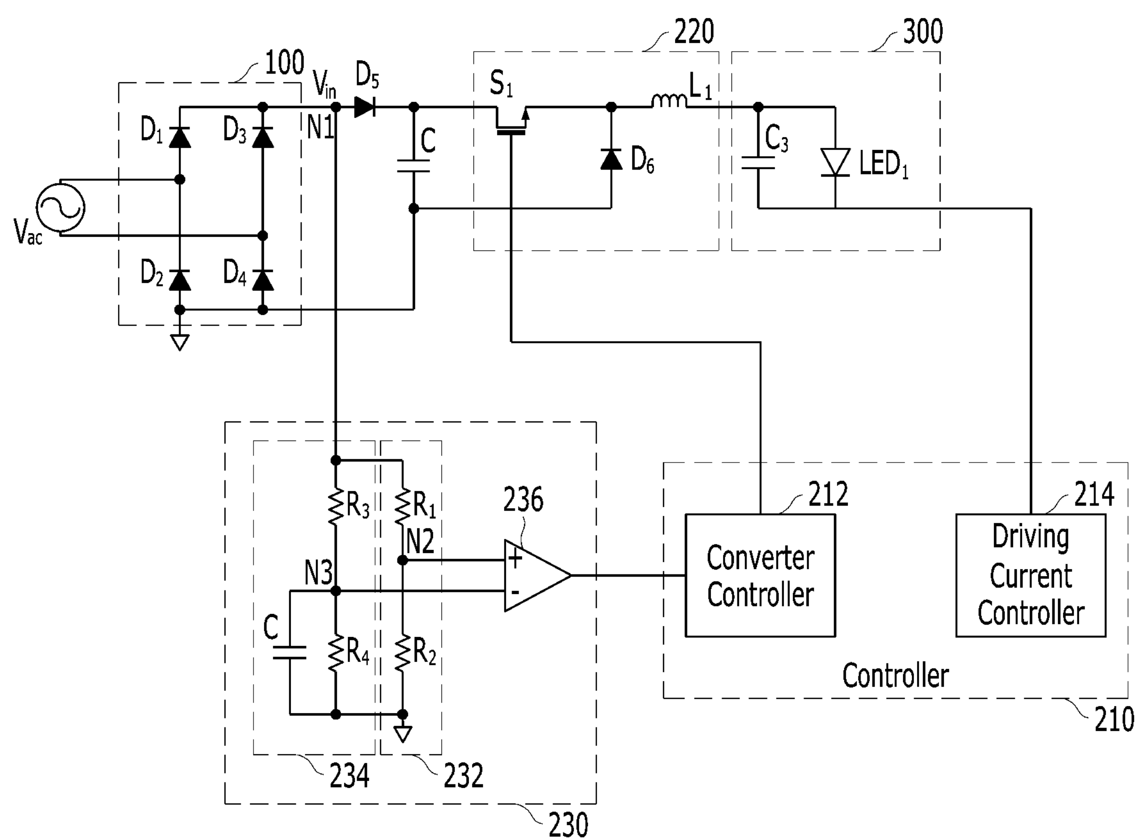
FIG. 2 is a schematic circuit diagram of the LED lighting apparatus according to an exemplary embodiment.

FIG. 1 is a block diagram of an LED lighting apparatus according to an exemplary embodiment, and FIG. 2 is a schematic circuit diagram of the LED lighting apparatus according to an exemplary embodiment. FIG. 3A to FIG. 3D are circuit diagrams illustrating an LED group of FIG. 1 according to exemplary embodiments, and FIG. 4 is a graph illustrating rectified voltage and time at which the LED driving current is applied to the LED group in correspondence to the rectified voltage.

Referring to FIG. 1 and FIG. 2, an LED lighting apparatus 10 according to an exemplary embodiment may include a rectifier 100, an LED driving circuit 200, and an LED 300. The LED driving circuit 200 may include a buck converter 220, a variable reference voltage comparator 230, and a controller 210.

The LED 300 may include at least one LED group $LED_1$. FIG. 2 exemplarily shows one LED group $LED_1$, however, the inventive concepts are not limited to a particular number of LED groups included in the LED 300. For example, the LED 300 may include n LED groups from a first LED group $LED_1$ to an $n^{th}$ LED group (n is a natural number greater than 1).

The LED group $LED_1$ may include at least one LED, and the number of LEDs included in the LED group, and a connection relation between the LEDs may be variously changed.

Figure 3A:
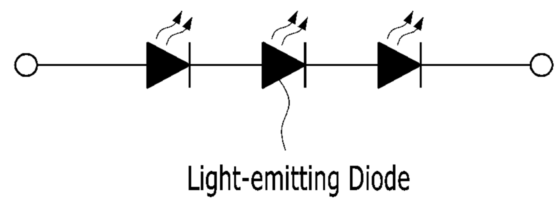
FIGS. 3A, 3B, 3C, and 3D are circuit diagrams of an LED group included in an LED of FIG. 1 according to exemplary embodiments.
Figure 3B:
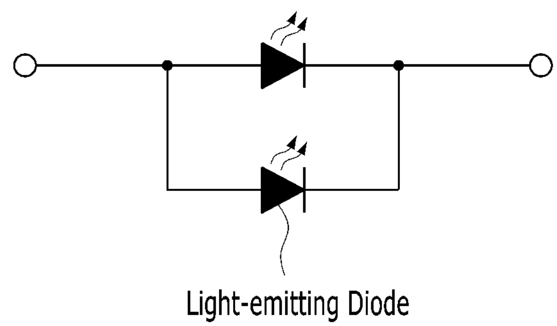
Figure 3C:
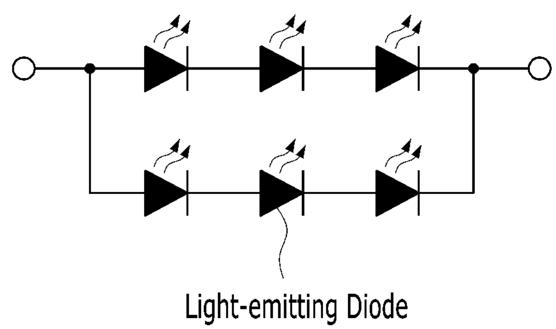
Figure 3D:
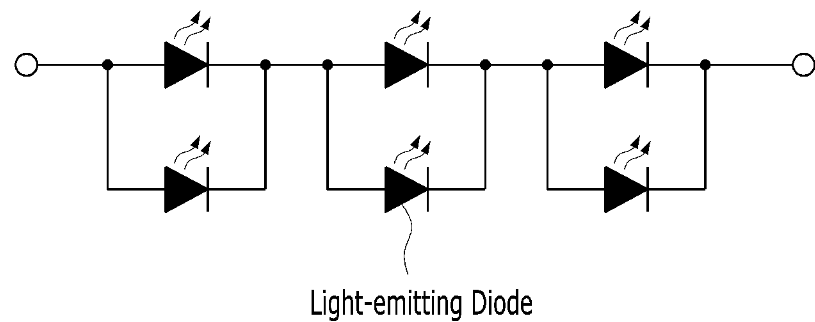
Figure 4:
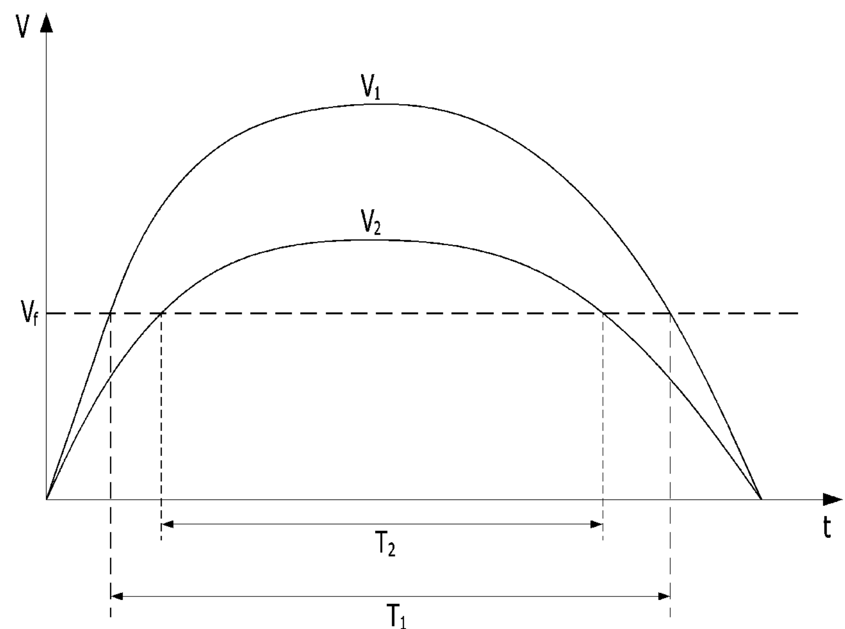
FIG. 4 is a graph illustrating rectified voltage and time at which the LED driving current is applied to the LED group.

FIG. 3A to FIG. 3D illustrate LED groups according to according to exemplary embodiments. Referring to FIG. 3A, the LED group may include a plurality of LEDs connected in series. Referring to FIG. 3B, each LED group may include a plurality of LEDs connected in parallel. Referring to FIG. 3C, each LED group may include sub-groups connected in parallel to each other and each sub-group may include LEDs connected in series. Referring to FIG. 3D, each LED group may include sub-groups connected in series to each other, and each sub-group may include a plurality of LEDs connected in parallel. According to the exemplary embodiments, the first LED group $LED_1$ and the second LED group may have the same forward voltage or forward voltages different from each other. The forward voltage is a threshold voltage capable of driving a corresponding LED group. For example, a first forward voltage level (Vf of FIG. 4) may be a threshold voltage level, at which the first LED group $LED_1$ can be driven.

The rectifier 100 is configured to rectify an AC voltage $V_{ac}$ input from an external AC power source, and generate and output a rectified voltage, and the rectified voltage may be a driving voltage $V_{in}$ that is applied to the LED 300. The rectifier 100 may employ a rectification circuit well-known in the art, such as a diode bridge circuit including diodes $D_1$ to $D_4$ as illustrated in FIG. 2. The external AC power may be commercial AC power or an AC voltage obtained by converting the commercial AC power through a low voltage transformer.

The LED driving circuit 200 according to an exemplary embodiment includes the buck converter 220, the variable reference voltage comparator 230, and the controller 210, as illustrated in FIG. 1 and FIG. 2.

The buck converter 220 receives the rectified voltage rectified by the rectifier 100 as is, and generates an LED driving current corresponding to the rectified voltage. Accordingly, the LED lighting apparatus 10 according to an exemplary embodiment implements a pulse current driving scheme of driving the LED using the LED driving current generated through the buck converter 220. In this manner, it is possible to remove an electrolytic capacitor for voltage smoothing included in a conventional rectifier.

Furthermore, by including the buck converter 220, the LED driving circuit 200 according to the illustrated exemplary embodiment can implement a peak current control mode buck topology. In this manner, it is possible to improve the power conversion efficiency of a conventional linear control type constant current control circuit.

In particular, the controller 210 may include a converter controller 212 that controls the operation of the buck converter 220, and a driving current controller 214 (or constant current controller) that controls a constant current applied to the LED group $LED_1$ included in the LED 300. For example, the driving current controller 214 may control the constant current applied to the LED group $LED_1$ through a pulse current driving scheme based on the peak current control mode buck topology.

Referring to FIG. 2, the buck converter 220 according to the illustrated exemplary embodiment includes a first inductor $L_1$, a diode $D_6$, and a control switch $S_1$.

The control switch $S_1$ is connected to an output terminal of the rectifier 100, and its operation is controlled by a control signal of the converter controller 212. The first inductor $L_1$ is connected between the control switch $S_1$ and the LED 300, and may generate an LED driving current $I_{LED1}$ corresponding to the driving voltage $V_{in}$ input through the rectifier 100. Furthermore, in order to prevent current backflow, the diode $D_6$ may be connected between a node, between the control switch $S_1$ and the first inductor $L_1$, and the output terminal of the rectifier 100 as illustrated in FIG. 2.

When the control switch $S_1$ is turned on, the voltage rectified by the rectifier 100, that is, the driving voltage $V_{in}$ is applied to the first inductor $L_1$, so that the LED driving current $I_{LED1}$ may be generated.

The buck converter 220 including the control switch $S_1$, the diode $D_6$, the first inductor $L_1$ according to an exemplary embodiment may be operated in a peak current mode when the driving voltage $V_{in}$ is greater than a threshold voltage level ($V_f$ of FIG. 4) of the LED group $LED_1$ included in the LED 300. More particularly, the LED driving circuit 200 including the buck converter 220 implements the peak current control mode buck topology by the LED driving current $I_{LED1}$ generated in the buck converter 220, and thus, may operate in a pulse current driving scheme.

The operation of the buck converter 220 is controlled by the converter controller 212, and the converter controller 212 operates by receiving an output signal $S_0$ of the variable reference voltage comparator 230.

A first capacitor $C_a$ illustrated in FIG. 2 may be installed to filter the input voltage rectified by the rectifier 100, and is different from an electrolytic capacitor for voltage smoothing included in the conventional rectifier. In this manner, it is possible to remove the electrolytic capacitor. The rectifier 100 illustrated in FIG. 2 may further include a diode $D_5$ for preventing backflow between the diode bridge circuit including the four diodes $D_1$ to $D_4$ and the first capacitor $C_a$.

Furthermore, the LED 300 illustrated in FIG. 2 may further include a second capacitor $C_b$ between the buck converter 220 and the LED group $LED_1$ for the purpose of filtering a switching current of the LED group $LED_1$.

The AC voltage $V_{ac}$ input to the LED lighting apparatus 10 may be commercial AC power or an AC voltage obtained by converting the commercial AC power through a low voltage transformer as described above. The driving voltage $V_{in}$ input to the LED 300 may have a large fluctuation range due to the fluctuation rate of the commercial AC voltage and/or a voltage drop occurring in an electric wire for connecting the low voltage transformer and at least one LED group.

FIG. 4 is a graph illustrating the rectified voltage and time at which the LED driving current is applied to the LED group in correspondence to the rectified voltage, which explains a fluctuation in an LED operation time due to a fluctuation in an AC power supply voltage, and illustrates.

As described above, the driving voltage $V_{in}$ input to the LED 300 may be input as voltages having different magnitudes due to the fluctuation in the input AC voltage $V_{ac}$ and/or the voltage drop in the electric wire. In particular, the driving voltage $V_{in}$ rectified by the rectifier 100 may be applied as a first driving voltage $V_1$ and a second driving voltage $V_2$ having different magnitudes as illustrated in FIG. 4. For example, the first driving voltage $V_1$ may be 18 $V_{ac}$ and the second driving voltage $V_2$ may be 12 $V_{ac}$.

Furthermore, since the LED group $LED_1$ included in the LED 300 of FIG. 2 has the first forward voltage level $V_f$, the LED driving current $I_{LED1}$ may be applied to the LED group $LED_1$ when the driving voltage ($V_1$ or $V_2$) has a magnitude equal to or greater than the first forward voltage level $V_f$.

Accordingly, as illustrated in FIG. 4, when the first driving voltage $V_1$ is applied, the LED driving current $I_{LED1}$ may be applied to the LED group $LED_1$ during a first period $T_1$, in which the first driving voltage $V_1$ has a magnitude equal to or greater than the first forward voltage level $V_f$. On the other hand, when the second driving voltage $V_2$ is applied, the LED driving current $I_{LED1}$ may be applied to the LED group $LED_1$ during a second period $T_2$, in which the second driving voltage $V_2$ has a magnitude equal to or greater than the first forward voltage level $V_f$.

As described above, when the driving voltage $V_{in}$ has a large fluctuation range, the conduction time of the LED driving current $I_{LED1}$ applied to the LED group $LED_1$ fluctuates according to the fluctuation in the driving voltage, which may change an average current value of the LED.

The LED driving circuit 200 according to an exemplary embodiment includes the variable reference voltage comparator 230, which uses a reference voltage that fluctuates according to a fluctuation range of the input AC power supply voltage. As such, the output signal $S_0$ of the variable reference voltage comparator 230 is input to the converter controller 212, and thus the buck converter 220 is controlled, thereby minimizing a change in the average current value of the LED that may otherwise occur due to the fluctuation in the AC power supply voltage, which is a disadvantage of the pulse current driving characteristics.

The variable reference voltage comparator 230 receives the driving voltage $V_{in}$, generates a reference value that is variable according to the degree of fluctuation in the driving voltage, and outputs a result value obtained by comparing the input driving voltage and the generated reference value. The output signal $S_0$ of the variable reference voltage comparator 230 is input to the converter controller 212 to control the buck converter 220.

As illustrated in FIG. 2, the variable reference voltage comparator 230 may include a driving voltage detection circuit 232, a variable reference voltage generation circuit 234, and a comparator 236.

The driving voltage detection circuit 232 includes a first resistor R1 and a second resistor R2, which are two voltage dividing resistors connected in series between a first node N1 connected to the output terminal of the rectifier 100 and the ground. A driving voltage divided by the voltage dividing resistors may be applied to a first input terminal (for example, a positive input terminal +) of the comparator 236. More particularly, a second node N2 between the first resistor R1 and the second resistor R2 may be connected to the first input terminal of the comparator 236.

The variable reference voltage generation circuit 234 includes a third resistor R3 and a fourth resistor R4, which are two voltage dividing resistors connected in series between the first node N1 connected to the output terminal of the rectifier 100 and the ground, and a holding capacitor C connected in parallel to the fourth resistor R4. The variable reference voltage generation circuit 234 may divide the driving voltage in substantially the same manner as the driving voltage detection circuit 232, and may store the divided driving voltage through the holding capacitor C to generate the stored driving voltage as a constant value. In particular, the variable reference voltage generation circuit 234 may generate a reference voltage corresponding to the driving voltage. Accordingly, when the driving voltage fluctuates, a fluctuation range of the driving voltage is reflected and the reference voltage also fluctuates accordingly. The reference voltage generated by the variable reference voltage generation circuit 234 may be applied to a second input terminal (for example, a negative input terminal −) of the comparator 236. A third node N3 between the third resistor R3 and the fourth resistor R4 may be connected to the second input terminal of the comparator 236.

The comparator 236 compares an instantaneous value of the driving voltage detected by the driving voltage detection circuit 232 with the variable reference voltage output from the variable reference voltage generation circuit 234, and outputs the output signal $S_0$. Accordingly, when the instantaneous value of the driving voltage is greater than the variable reference voltage, the buck converter 220 may operate according to the output signal $S_0$ of the variable reference voltage comparator 230.

In this case, since the variable reference voltage finally increases/decreases in proportion to a change in the magnitude of the input AC voltage, it is possible to minimize, through the variable reference voltage comparator 230, a change in the average current value of the LED occurring due to the fluctuation in the AC power supply voltage, which is a disadvantage of the pulse current driving characteristics.

As illustrated in FIG. 4, the operation time of the LED group fluctuates due to a fluctuation in an AC power supply voltage, which results in a fluctuation in the average value of a current applied to the LED group. As light output of the LED changes, it may be difficult to maintain constant light output.

According to an exemplary embodiment, since the operation of the buck converter 220 is controlled through the output signal of the variable reference voltage comparator 230, even though the AC power supply voltage fluctuates, it is possible to control the LED group to always have a constant operation time. As a constant current is supplied to the LED, it is possible to maintain uniform light output.

Figure 5A:
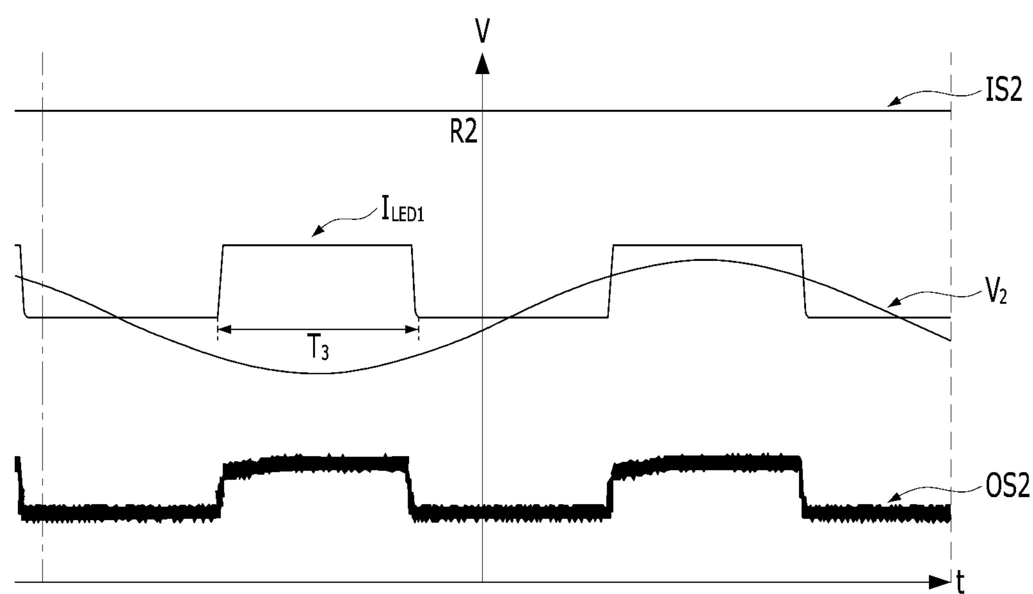
FIG. 5A and FIG. 5B are graphs illustrating an operation of an LED driving circuit according to an exemplary embodiment.
Figure 5B:
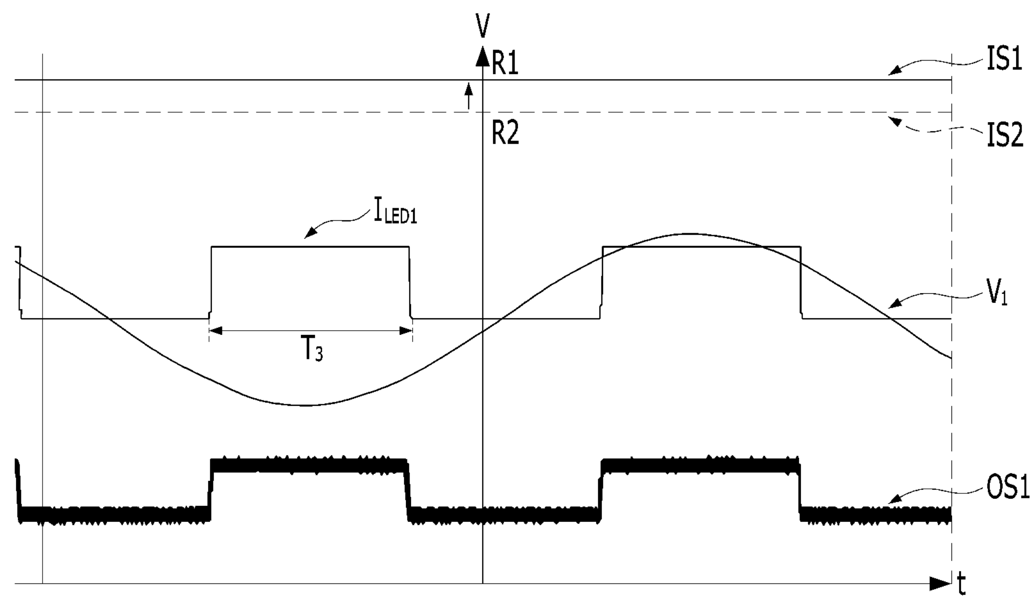

FIG. 5A and FIG. 5B are graphs for explaining the operation of the LED driving circuit according to an exemplary embodiment, and illustrate a case where the operation of the buck converter 220 is controlled by the output signal $S_0$ of the variable reference voltage comparator 230.

As described above, the AC power applied to the LED lighting apparatus 10 may be input as voltages having different magnitudes. FIGS. 5A and 5B exemplarily illustrate that a first input voltage $V_1$ and a second input voltage $V_2$ applied have different magnitudes.

First, FIG. 5A is a graph for explaining a case where the second input voltage $V_2$ is applied, and the second input voltage $V_2$ is AC power applied to the LED lighting apparatus 10, and may correspond to the rectified second driving voltage $V_2$ of FIG. 4. Accordingly, the second input voltage $V_2$ may be 12 $V_{ac}$, for example.

When the second input voltage is applied as AC power, as described above, the variable reference voltage comparator 230 detects the rectified second driving voltage through the driving voltage detection circuit 232, and generates a second variable reference voltage IS2 corresponding to the second driving voltage through the variable reference voltage generation circuit 234. Then, the comparator 236 in the variable reference voltage comparator 230 compares the instantaneous value of the second driving voltage detected by the driving voltage detection circuit 232 with the second variable reference voltage IS2 output from the variable reference voltage generation circuit 234, and outputs a second output signal OS2. At this time, the magnitude of the second variable reference voltage IS2 generated corresponding to the second input voltage $V_2$ may be R2 as shown in FIG. 5A.

The second output signal OS2 corresponds to a signal that is output when the instantaneous value of the second driving voltage is greater than the second variable reference voltage IS2, and the buck converter 220 may operate according to the second output signal OS2 to generate the LED driving current $I_{LED1}$ illustrated in the drawing.

Furthermore, as illustrated in FIG. 5A, the LED driving current $I_{LED1}$ may be applied to the LED group $LED_1$ during a third period $T_3$, in which the second input voltage $V_2$ has a magnitude equal to or greater than the first forward voltage level $V_f$.

Next, FIG. 5B is a graph for explaining a case where the first input voltage $V_1$ is applied, and the first input voltage $V_1$ is AC power applied to the LED lighting apparatus 10, and may correspond to the rectified first driving voltage $V_1$ of FIG. 4. Accordingly, the first input voltage $V_1$ may be 18 $V_{ac}$, for example.

When the first input voltage is applied as AC power, as described above, the variable reference voltage comparator 230 detects the rectified first driving voltage through the driving voltage detection circuit 232, and generates a first variable reference voltage IS1 corresponding to the first driving voltage through the variable reference voltage generation circuit 234. Then, the comparator 236 in the variable reference voltage comparator 230 compares the instantaneous value of the first driving voltage detected by the driving voltage detection circuit 232 with the first variable reference voltage IS1 output from the variable reference voltage generation circuit 234, and outputs a first output signal OS1. At this time, the magnitude of the first variable reference voltage IS1 generated corresponding to the first input voltage $V_1$ may be R1 as shown in FIG. 5B, which is greater than the magnitude of the second variable reference voltage IS2 R2 shown in FIG. 5A.

As such, according to an exemplary embodiment, as the input AC voltage fluctuates, the magnitude of the variable reference voltage also fluctuates accordingly. For example, when the difference between the magnitudes of the first input voltage $V_1$ and the second input voltage $V_2$ is 6 V, the difference between the magnitude R1 of the first variable reference voltage IS1 and the magnitude R2 of the second variable reference voltage IS2 may also be 6 V.

Accordingly, the first output signal OS1 corresponds to a signal that is output when the instantaneous value of the driving voltage is greater than the first variable reference voltage IS1, and the buck converter 220 may operate according to the first output signal OS1 to generate the LED driving current $I_{LED1}$ illustrated in the drawing.

If the first variable reference voltage IS1 does not fluctuate and has the same magnitude R2 as that of the second variable reference voltage IS2 illustrated in FIG. 5A, since the first input voltage $V_1$ is greater than the second input voltage $V_2$, the comparator outputs the first output signal OS1 different (having a larger width than) from the second output signal OS2 as shown in FIG. 5A. As such, the conduction time of the LED driving current $I_{LEI}$ applied to the LED group $LED_1$ fluctuates according to the fluctuation in the driving voltage, as shown in FIG. 4, which causes a problem that the average current value of the LED is changed.

However, according to an exemplary embodiment, since the magnitude R1 of the first variable reference voltage IS1 generated corresponding to the first input voltage $V_1$ as shown in FIG. 5B is greater than the magnitude R2 of the second variable reference voltage IS2 shown in FIG. 5A, the first output signal OS1 is a signal substantially the same as the second output signal OS2 as shown in FIG. 5A. In particular, since the signals input to both terminals of the comparator 236 fluctuate identically, the output signal of the comparator 236 may be kept the same.

Accordingly, as illustrated in FIG. 5B, even though the AC power applied to the LED lighting apparatus 10 is changed from the second input voltage $V_2$ to the first input voltage $V_1$, the LED driving current $I_{LED1}$ may be applied to the LED group $LED_1$ during the third period T3 as shown in FIG. 5A. In particular, even though the input AC voltage fluctuates, an average value of a current supplied to the LED group can be kept constant.

Figure 6:
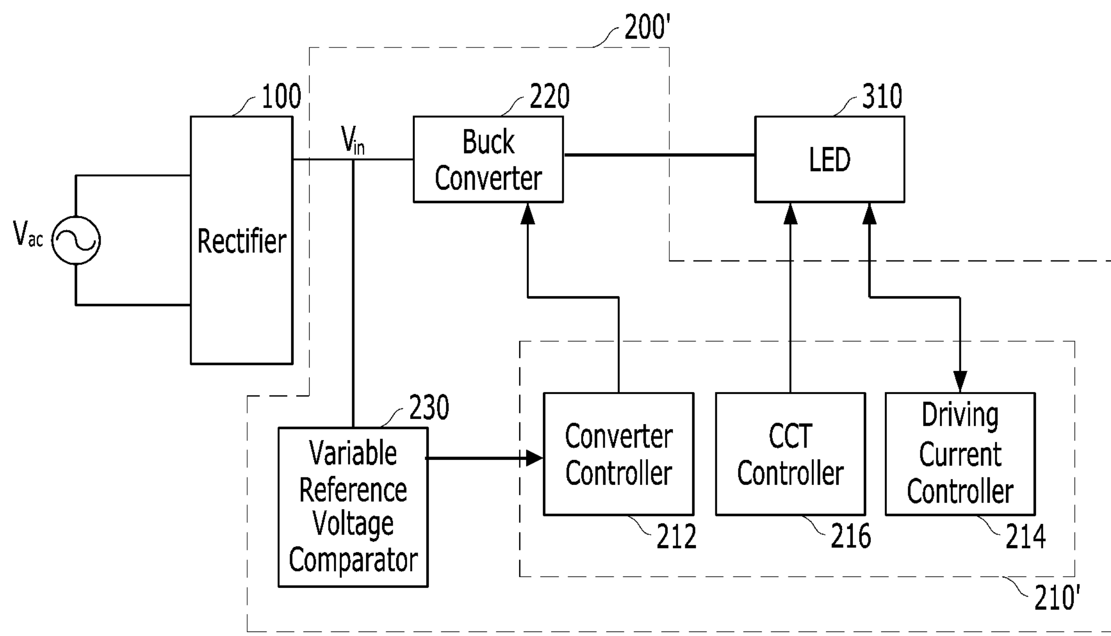
FIG. 6 is a block diagram of an LED lighting apparatus according to another exemplary embodiment.

FIG. 6 is a block diagram of an LED lighting apparatus according to another exemplary embodiment.

The LED lighting apparatus shown in FIG. 6 is different from that of FIG. 1, in that the configuration of an LED 310 of an LED driving circuit 200' is changed, and a CCT controller 216 is added to a controller 210' in accordance to the configuration of the LED 310.

Accordingly, the same configurations as those shown in FIG. 1 are denoted by the same reference numerals, repeated descriptions thereof will be omitted, and the configurations and operations of the LED 310 and the CCT controller 216 will be mainly described in more detail below with reference to FIG. 7 and FIG. 8.

Figure 7:
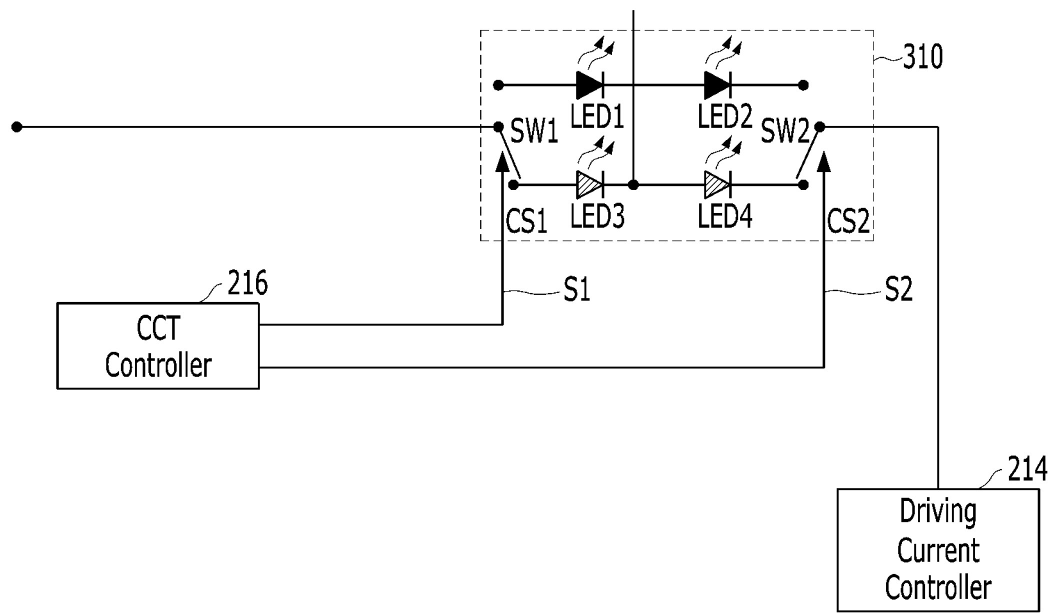
FIG. 7 is a diagram illustrating a connection relation between an LED and a CCT controller of the LED lighting apparatus of FIG. 6.

FIG. 7 is a diagram illustrating a connection relation between the LED and the CCT controller of the LED lighting apparatus illustrated in FIG. 6, and FIG. 8A to FIG. 8C are diagrams for explaining an operation of the LED illustrated in FIG. 7.

Referring to FIG. 7, the LED 310 may include a first LED group LED1, a second LED group LED2, a third LED group LED3, a fourth LED group LED4, a first switch SW1, and a second switch SW2. According to an exemplary embodiment, the color temperature of the first LED group LED1 and the color temperature of the second LED group LED2 may be substantially the same, while being different from the color temperature of the third LED group LED3, and the color temperature of the third LED group LED3 and the color temperature of the fourth LED group LED4 may be substantially the same. The first LED group LED1 and the second LED group LED2 may have a color temperature between about 1500 K and about 3000 K, and the third LED group LED3 and the fourth LED group LED4 may have a color temperature between about 4000 K and about 7000 K, for example.

In FIG. 7, the LED 310 according to an exemplary embodiment is shown as including four LED groups LED1 to LED4 and two switches SW1 and SW2; however, the inventive concepts are not limited thereto.

Each of the first to fourth LED groups LED1 to LED4 may include at least one LED, as shown in FIGS. 3A to 3D. However, the inventive concepts are not limited thereto, and the number of LEDs included in each LED group and a connection relation between the LEDs may be variously changed.

The CCT controller 216 receives a color temperature selection signal and outputs a control signal for controlling the operations of the switches of the LED 310. The color temperature selection signal may be received through a communication network.

Furthermore, the driving current controller 214, which controls a constant current applied to the LED groups included in the LED 310, may be connected to the LED 310 as illustrated in the drawing. For example, the driving current controller 214 may control the constant current applied to the first LED group LED1 through the pulse current driving scheme based on the peak current control mode buck topology.

Figure 8A:
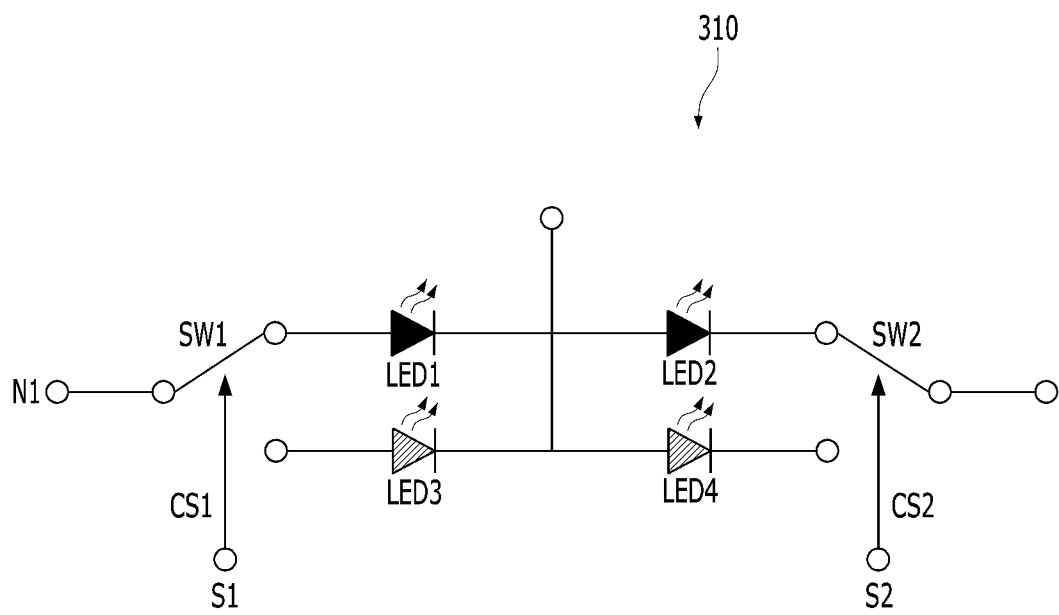
FIGS. 8A, 8B, and 8C are diagrams illustrating an operation of the LED of FIG. 7.
Figure 8B:
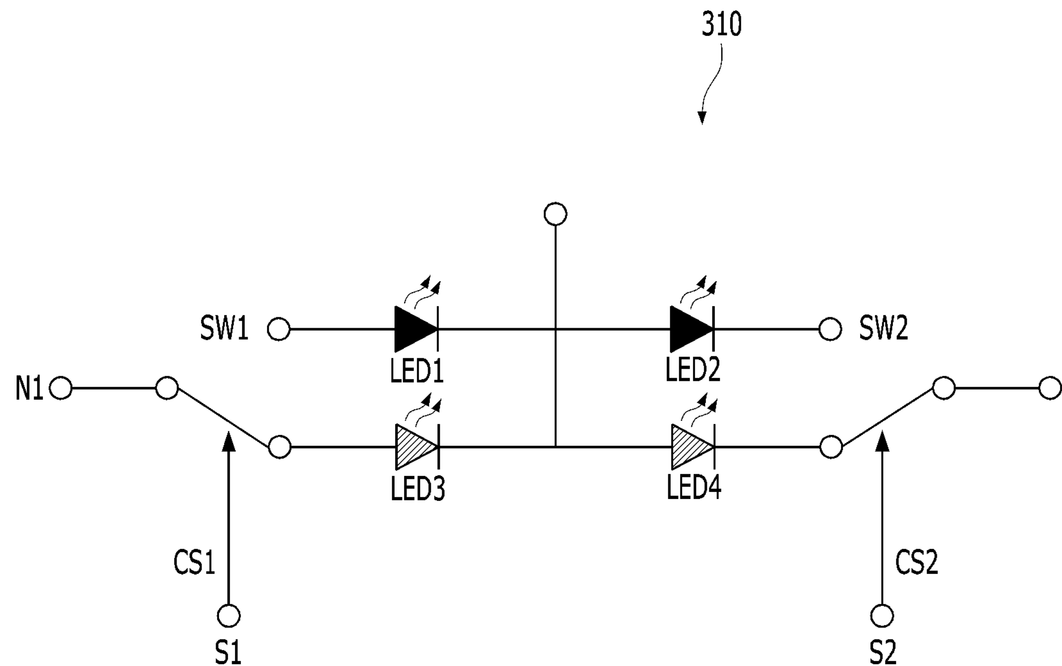
Figure 8C:
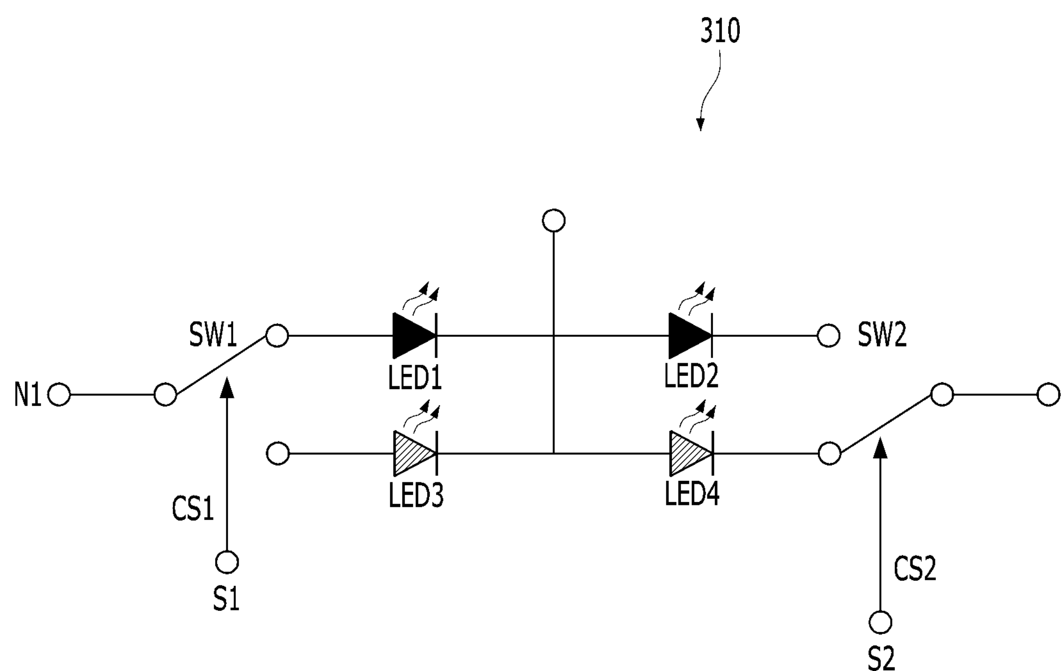

Referring to FIG. 8A to FIG. 8C, the LED 310 includes the first switch SW1, the first LED group LED1, the second LED group LED2, the third LED group LED3, the fourth LED group LED4, and the second switch SW2. The first switch SW1 is connected to a node N1, to which a rectified voltage is applied, and receives a first control signal CS1 from a CCT controller 216. The first LED group LED1 is selectively connected to the node N1, to which the rectified voltage is applied, by the first switch SW1. The second LED group LED2 is connected in series with the first LED group LED1. The third LED group LED3 is selectively connected to the node N1, to which the rectified voltage is applied, by the first switch SW1. The fourth LED group LED4 is connected in series with the third LED group LED3. The second switch SW2 receives a second control signal CS2, and selectively connects an output terminal of the second LED group LED2 or the fourth LED group LED4 and the driving current controller 214.

A node between the first LED group LED1 and the second LED group LED2 and a node between the third LED group LED3 and the fourth LED group LED4 are connected in parallel.

According to an exemplary embodiment, the color temperature of the first LED group LED1 and the color temperature of the second LED group LED2 may be substantially the same, but may be different from the color temperature of the third LED group LED3, and the color temperature of the third LED group LED3 and the color temperature of the fourth LED group LED4 may be substantially the same. The first LED group LED1 and the second LED group LED2 may have a color temperature between about 1500 K and about 3000 K, and the third LED group LED3 and the fourth LED group LED4 may have a color temperature between about 4000 K and about 7000 K, for example.

Referring to FIG. 8A, the first switch SW1 connects the node N1, to which the rectified voltage is applied, and an input terminal of the first LED group LED1 by the first control signal CS1, and the second switch SW2 connects an output terminal of the second LED group LED2 and the driving current controller 214 by the second control signal CS2. In such a case, a driving current flows through the first LED group LED1 and the second LED group LED2, and the lighting apparatus 10 emits light with a warm-white color having a color temperature between about 1500 K and about 3000 K, for example.

Referring to FIG. 8B, the first switch SW1 connects the node N1, to which the rectified voltage is applied, and an input terminal of the third LED group LED3 by the first control signal CS1, and the second switch SW2 connects an output terminal of the fourth LED group LED4 and the driving current controller 214 by the second control signal CS2. In such a case, a driving current flows through the third LED group LED3 and the fourth LED group LED4, and the lighting apparatus 10 emits light with a cool-white color having a color temperature between about 4000 K and about 7000 K, for example.

Referring to FIG. 8C, the first switch SW1 connects the node N1, to which the rectified voltage is applied, and an input terminal of the first LED group LED1 by the first control signal CS1, and the second switch SW2 connects an output terminal of the fourth LED group LED4 and the driving current controller 214 by the second control signal CS2. In such a case, a driving current flows through the first LED group LED1 and the fourth LED group LED4. In such a case, since the first LED group LED1 and the fourth LED group LED4 emit light, the lighting apparatus 10 emits light having a color temperature between warm-white and cool-white, for example. As such, by adjusting the number of LEDs included in each of the first LED group LED1 and the fourth LED group LED4, it is possible to emit light having a desired color temperature between 3000 K and 4000 K, for example.

As described above, it is possible to control the operations of the first switch SW1 and the second switch SW2 through the first control signal CS1 and the second control signal CS2, and the number of LEDs included in each of the first to fourth LED groups LED1 to LED4 and the arrangement thereof are adjusted, so that it is possible to emit light having a color temperature desired by the lighting apparatus.

According to exemplary embodiments, the light apparatus includes a buck converter that receives a rectified voltage as is and generates an LED driving current corresponding to the rectified voltage, and implements a pulse current driving scheme of driving the LED by using the generated LED driving current, so that it is possible to remove an electrolytic capacitor for voltage smoothing included in an existing rectifier. In addition, it is possible to implement a peak current control mode buck topology, thereby improving the power conversion efficiency of an existing linear control type constant current control circuit.

Furthermore, the light apparatus according to exemplary embodiments includes a variable reference voltage comparator, which uses a reference voltage that fluctuates according to a fluctuation range of an AC power supply voltage, and controls the buck converter through an output signal of the comparator, thereby minimizing a change in an average current value of an LED occurring due to a fluctuation in an AC power supply voltage, which is a disadvantage of the pulse current driving characteristics.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An LED lighting apparatus comprising:

a rectifier configured to rectify AC voltages having different magnitudes and generate driving voltages corresponding to rectified voltages;

a buck converter connected to an output terminal of the rectifier, and configured to receive the driving voltages and generate an LED driving current corresponding to the driving voltages;

a variable reference voltage comparator including:

a plurality of first voltage dividing resistors configured to divide the driving voltages output from the rectifier;

a plurality of second voltage diving resistors and a holding capacitor configured to divide the driving voltages and to generate variable reference voltages that fluctuate in correspondence to magnitudes of the output driving voltages; and a comparator configured to compare the driving voltages and the variable reference voltages, and output signals for controlling an operation of the buck converter;

an LED circuit including at least one LED group and configured to be driven by the LED driving current generated by the buck converter; and a controller including a converter controller configured to control the operation of the buck converter and a constant current controller configured to constant current-control the LED driving current applied to the at least one LED group.

2. The LED lighting apparatus according to claim 1, wherein the buck converter comprises:

a control switch connected to an output terminal of the rectifier, and configured to be controlled by a control signal of the converter controller; and a first inductor connected between the control switch and the LED circuit, and configured to generate the LED driving current.

3. The LED lighting apparatus according to claim 1, wherein:

a driving voltage detection circuit of the variable reference voltage comparator includes the plurality of first voltage dividing resistors which are connected in series between a first node connected to the output terminal of the rectifier and a ground;

a variable reference voltage generation circuit of the variable reference voltage comparator includes the plurality of second voltage dividing resistors and the holding capacitor, the plurality of second voltage dividing resistors being connected in series between the first node connected to the output terminal of the rectifier and the ground, and the holding capacitor being connected in parallel to one of the second voltage dividing resistors; and the comparator is configured to compare an instantaneous value of the driving voltage detected by the driving voltage detection circuit with a variable reference voltage output from the variable reference voltage generation circuit, and to output an output signal to the converter controller.

4. The LED lighting apparatus according to claim 3, wherein a second node between the first voltage dividing resistors is connected to a first input terminal of the comparator; and a third node between the second voltage dividing resistors is connected to a second input terminal of the comparator.

5. The LED lighting apparatus according to claim 4, wherein the first input terminal of the comparator is a positive input terminal of the comparator and the second input terminal of the comparator is a negative input terminal of the comparator.

6. The LED lighting apparatus according to claim 3, wherein the output signal from the comparator has the same magnitude and width regardless of a magnitude of the driving voltage output from the rectifier.

7. The LED lighting apparatus according to claim 1, wherein:

the AC voltages having different magnitudes include a first input voltage having a first magnitude and a second input voltage having a second magnitude; and the rectifier is configured to generate a first driving voltage in correspondence to the first input voltage and a second driving voltage in correspondence to the second input voltage.

8. The LED lighting apparatus according to claim 7, wherein:

the variable reference voltage comparator is configured to generate a first variable reference voltage corresponding to a magnitude of the first driving voltage and a second variable reference voltage corresponding to a magnitude of the second driving voltage; and a difference between the magnitudes of the first and second driving voltages is substantially equal to a difference between the magnitudes of the first and second variable reference voltages.

9. An LED lighting apparatus comprising:

a rectifier configured to rectify AC voltages having different magnitudes and generate driving voltages corresponding to rectified voltages;

a buck converter connected to an output terminal of the rectifier, and configured to receive the driving voltages and generate an LED driving current corresponding to the driving voltages;

a variable reference voltage comparator configured to receive the driving voltages output from the rectifier, generate variable reference voltages that fluctuate in correspondence to magnitudes of the output driving voltages, compare the driving voltages and the variable reference voltages, and output signals for controlling an operation of the buck converter;

an LED circuit including at least one LED group and configured to be driven by the LED driving current generated by the buck converter, the LED circuit comprises:

a first switch connected to a first node connected to the output terminal of the rectifier and configured to receive a first control signal;

a first LED group configured to be selectively connected to the first node by the first switch;

a second LED group connected in series with the first LED group;

a third LED group configured to be selectively connected to the first node by the first switch;

a fourth LED group connected in series with the third LED group; and a second switch configured to receive a second control signal and selectively connect an output terminal of the second LED group or the fourth LED group and the constant current controller; and a controller including a converter controller configured to control the operation of the buck converter and a constant current controller configured to constant current-control the LED driving current applied to the at least one LED group.

10. The LED lighting apparatus according to claim 9, wherein the controller further comprises a color temperature controller configured to receive a color temperature selection signal and output the first and second control signals.

11. An LED driving circuit comprising:

a buck converter configured to receive rectified voltages having different magnitudes as driving voltages and generate an LED driving current corresponding to the driving voltages;

a variable reference voltage comparator configured to receive the driving voltages having different magnitudes, generate variable reference voltages that fluctuate in correspondence to magnitudes of the driving voltages, compare the driving voltages and the variable reference voltages, and output signals to control an operation of the buck converter; and a converter controller configured to control the operation of the buck converter, wherein a difference between the magnitudes of the driving voltages is substantially equal to a difference between the magnitudes of the variable reference voltages.

12. The LED driving circuit according to claim 11, wherein the buck converter comprises:

a control switch controlled by a control signal of the converter controller; and a first inductor connected between the control switch and at least one LED group, and configured to generate the LED driving current.

13. The LED driving circuit according to claim 11, wherein the variable reference voltage comparator comprises:

a driving voltage detection circuit including a first resistor and a second resistor connected in series to divide the driving voltage;

a variable reference voltage generation circuit including a third resistor and a fourth resistor connected in series to divide the driving voltage, and a holding capacitor connected in parallel to the fourth resistor; and a comparator configured to compare an instantaneous value of the driving voltage detected by the driving voltage detection circuit with a variable reference voltage output from the variable reference voltage generation circuit, and output an output signal to the converter controller.

14. The LED driving circuit according to claim 13, wherein:

a second node between the first resistor and the second resistor is connected to a first input terminal of the comparator; and a third node between the third resistor and the fourth resistor is connected to a second input terminal of the comparator.

15. The LED driving circuit according to claim 14, wherein the first input terminal of the comparator is a positive input terminal of the comparator and the second input terminal of the comparator is a negative input terminal of the comparator.

16. The LED driving circuit according to claim 13, wherein the output signal from the comparator has the same magnitude and width regardless of a magnitude of the driving voltage output from the rectifier.

17. The LED driving circuit according to claim 11, wherein the driving voltages having different magnitudes include a first driving voltage having a first magnitude and a second driving voltage having a second magnitude.

18. The LED driving circuit according to claim 17, wherein:

the variable reference voltage comparator is configured to generate a first variable reference voltage corresponding to a magnitude of the first driving voltage and generate a second variable reference voltage corresponding to a magnitude of the second driving voltage; and a difference between the magnitudes of the first and second driving voltages is substantially equal to a difference between the magnitudes of the first and second variable reference voltages.

* * * * *